United States Patent [19]

Yamamoto et al.

[11] Patent Number: 5,034,962
[45] Date of Patent: Jul. 23, 1991

[54] VOICE-BAND SIGNAL PROCESSOR

[75] Inventors: Kazushige Yamamoto; Osamu Yanaga, both of Tokyo, Japan

[73] Assignee: Oki Electric Industry Co., Ltd., Tokyo, Japan

[21] Appl. No.: 373,682

[22] Filed: Jun. 28, 1989

[30] Foreign Application Priority Data

Jul. 1, 1988 [JP] Japan .................................. 63-165770
Jul. 1, 1988 [JP] Japan .................................. 63-165771

[51] Int. Cl.$^5$ ............................................. H03H 17/00
[52] U.S. Cl. ............................................. 375/8; 375/96
[58] Field of Search ................... 375/7, 8, 96; 370/24, 370/31; 341/106; 364/724.1; 332/106; 329/311

[56] References Cited

U.S. PATENT DOCUMENTS

| | | | |
|---|---|---|---|
| 4,310,721 | 1/1982 | Manley et al. | 375/8 |
| 4,633,225 | 12/1986 | Hayashi et al. | 364/724.1 |
| 4,633,426 | 12/1986 | Venier | 375/96 |
| 4,677,645 | 6/1987 | Kaniwa et al. | 375/8 |
| 4,908,787 | 3/1990 | Dyer | 364/724.1 |

OTHER PUBLICATIONS

Yamamoto et al., "Front-End Processor for Modems," ISSCC Digest of Tech. papers, Feb. 1989, New York, pp. 262-263.
Douglas B. Cox et al., "A Real-Time Programmable Switched-Capacitor Filter," IEEE Journal of Solid-State Circuits, vol. SC-15, No. 6, Dec. 1980, pp. 972-974.

Primary Examiner—Benedict V. Safourek
Assistant Examiner—Young Tse
Attorney, Agent, or Firm—Spencer & Frank

[57] ABSTRACT

A voice-band signal processor uses a DSP to filter digital transmit and receive voice-band signals, and has oversampling D/A and A/D converters with a frequency converter to convert between the oversampling rate and the DSP rate. An interpolator converts the filtered receive voice-band signal to a pseudo-analog signal that can be sampled by a demodulator in synchronization with a regenerated receive sampling clock, thus enabling correct operation even when the transmit and receive sampling clock rates do not match. In addition, the voice-band signal processor contains a status register circuit connected to flag registers in the DSP, enabling a host computer to read and set flag values that control the operating mode of the voice-band signal processor. The voice-band signal processor can thus be switched between half duplex and full duplex operation, or between different bit rates.

15 Claims, 6 Drawing Sheets

VOICE-BAND SIGNAL PROCESSOR

BACKGROUND OF THE INVENTION

This invention relates to a voice-band signal processor equipped with digital-to-analog and analog-to-digital converters for use in apparatus such as a full duplex modem.

Modems enable widely separated digital devices such as computers to exchange data over a telephone line or other communication line that was originally intended for voice communication. To reduce size and cost, many recent modem designs employ digital signal processing elements. A modem of these designs comprises a modulator for receiving serial bit data from a host computer and converting it to a digital voice-band signal, and converting it to serial bit data to be sent to the host computer, and a voice-band signal processor for filtering the voice-band signals and converting them between analog and digital form.

Among prior-art designs of voice-band signal processors, one design employs a programmable digital signal processor (hereinafter referred to as a DSP), a frequency converter, a digital-to-analog converter (hereinafter referred to as a D/A converter), and an analog-to-digital converter (hereinafter referred to as an A/D converter). The DSP filters the voice-band signals in digital form, restricting them to a limited frequency band suitable for the rate at which bits are transmitted and received. The D/A converter converts a filtered voice-band transmit signal from digital to analog form so that it can be placed on the communication line. The A/D converter converts an analog voice-band receive signal from the communication line to digital form, so that it can be filtered by the DSP. Both the D/A and A/D converters are oversampling devices, meaning that their sampling rate exceeds the rate at which the DSP operates. The frequency converter converts between the A/D and D/A sampling rate on the one hand and the DSP rate on the other hand by performing an interpolation or decimation process.

An advantage of this prior-art voice-band signal processor design is that it is simple and compact, and the DSP can be programmed to support a variety of communication rates. However, this design has two problems.

The first problem arises during full duplex operation when the transmit and receive sampling clock rates are not exactly matched, a situation which can easily occur due to slight differences between the crystal oscillators employed at the transmitting and receiving ends. The DSP operates at the transmit sampling clock rate, yet it must filter both the transmit and receive voice-band signals, so it processes them alternately, using half the time in each transmit sampling clock period to filter the transmit signal and half the time to filter the receive signal. If the transmit and receive clock rates are out of step, the DSP will occasionally generate receive data belonging to the wrong receive clock sampling period, causing the demodulator to receive a value differing greatly from the correct value.

The second problem arises when it is necessary to change the communication mode: to change from a rate of 300 bits per second to a rate of 1200 bits per second, for example. The filtering program of the DSP is stored in a programmable read-only memory (hereinafter referred to as a PROM). During the manufacturing process any desired program can we written in the PROM, but once the DSP has been programmed, the program cannot be altered. Accordingly, although it is easy to manufacture voice-band signal processors programmed for operation in different modes, it is not possible to change the mode afterward, which places an inconvenient restriction on the use of the voice-band signal processor.

SUMMARY OF THE INVENTION

It is accordingly an object of the present invention to avoid the output of greatly incorrect receive signal values in full duplex communication, even when the transmit and receive sampling clock rates are not exactly matched.

It is also an object of this invention to enable operation in a variety of communication modes.

A voice-band signal processor according to this invention comprises a DSP for receiving a digital transmit voice-band signal and performing a digital filtering process to generate a filtered digital transmit voice-band signal, and for receiving a digital receive voice-band signal and performing a digital filtering process to generate a filtered digital receive voice-band signal, a D/A converter for receiving the filtered digital transmit voice-band signal and converting it to analog form to generate an analog transmit voice-band signal, an A/D converter for receiving an analog receive voice-band signal and converting it to digital form to generate the digital receive voice-band signal mentioned earlier, and an interpolator for receiving the filtered digital receive voice-band signal and performing an interpolation process to generate a pseudo-analog receive voice-band signal.

The DSP comprises one or more flag registers for storing information pertaining to the communication mode, and has a programmable read-only memory divided into different program areas that are selected according to information in the flag registers. The voice-band signal processor further comprises a status register circuit coupled to these flag registers so that information can be transferred between the status register circuit and the flag registers. Information can be written in and read from the status register circuit by an external device.

DETAILED DESCRIPTION OF THE PREFERRED EMBODIMENTS

A detailed description will next be given of a novel voice-band signal processor for converting a digital transmit voice-band signal to an analog transmit voice-band signal, and an analog receive voice-band signal to a pseudo-analog receive voice-band signal. The voice-band signal processor will be shown as receiving a digital transmit voice-band signal and a transmit sampling clock signal from a modulator, and the analog receive voice-band signal from a voice-band communication line, filtering the digital transmit voice-band signal and converting it to the analog transmit voice-band signal to be provided to the communication line, converting the analog receive voice-band signal to a digital signal, filtering it, then converting it to the pseudo-analog voice-band signal to be supplied to a demodulator, and exchanging communication mode data and the like with an external device such as a host computer. The modulator, demodulator, voice-band communication line, and host computer will not be explicitly shown in the drawings.

Figure 1:
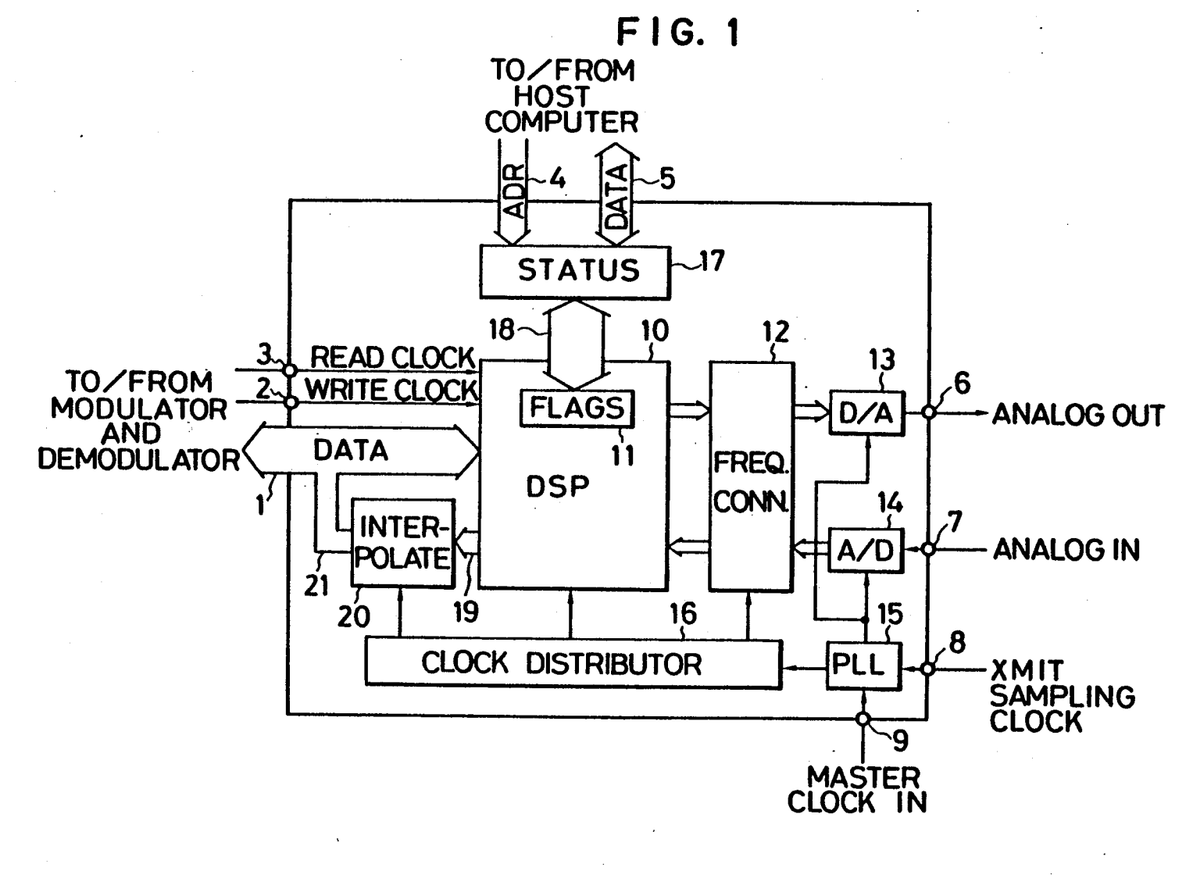
FIG. 1 is a block diagram of the novel voice-band signal processor.

FIG. 1 is a block diagram of the novel voice-band signal processor. A description of its input and output terminals will be given, followed by a description of its internal blocks.

For communication with the above-mentioned modulator and demodulator, the voice-band signal processor has a main bus 1 that carries digital transmit data from the modulator to the voice-band signal processor, and filtered digital receive data from the voice-band signal processor to the demodulator. The main bus 1 has a data width of, for example, 16 bits. The voice-band signal processor also has a write clock input terminal 2 at which it receives a write clock signal from the modulator, and a read clock input terminal 3 at which it receives a read clock signal from the demodulator, these signals controlling the transfer of data via the main bus 1.

For communication with a host computer, the voice-band signal processor has a control/address bus 4 and a status data bus 5.

The voice-band signal processor also has an analog output terminal 6 and an analog input terminal 7, which can be connected via devices such as buffer amplifiers and a hybrid transformer to a voice-band communication line. The analog output terminal 6 sends a voice-band analog transmit signal generated by the voice-band signal processor. The analog input terminal 7 receives a voice-band analog receive signal from the communication line.

Finally, the voice-band signal processor has a sampling clock input terminal 8 at which it receives a transmit sampling clock signal from the modulator, and a master clock input terminal 9 at which it receives a master clock signal from a device such as an oscillator.

Internally, the voice-band signal processor comprises a DSP 10 for receiving a digital voice-band signal, filtering it to restrict it to a desired frequency band, and producing the filtered digital signal as output. The operation of the DSP 10 is controlled according to one or more flag registers 11 disposed inside the DSP 10. The DSP 10 is connected to the main bus 1, the write clock input terminal 2, and the read clock input terminal 3.

The voice-band signal processor also comprises a frequency converter 12 for receiving the digital voice-band signal, performing a sample interpolation or decimation operation, and producing an equivalent digital voice-band signal with a higher or lower sampling frequency. The frequency converter 12 is connected to the DSP 10.

The voice-band signal processor further comprises a D/A converter 13 and an A/D converter 14. The D/A converter 13 receives the digital voice-band signal from the frequency converter 12, converts it to an analog voice-band signal, and provides the analog voice-band signal to the analog output terminal 6. The A/D converter 14 receives the analog voice-band signal from the analog input terminal 7, converts it to a digital voice-band signal, and provides the digital voice-band signal to the frequency converter 12. The D/A converter 13 and the A/D converter 14 are both oversampling devices of, for example, the well-known delta-sigma type.

The voice-band signal processor in addition comprises a phase-locked loop 15 and a clock distributor 16. The phase-locked loop 15 receives the transmit sampling clock signal from the sampling clock input terminal 8 and the master clock signal from the master clock input terminal 9 and generates internal clock signals which it supplies to the D/A converter 13, the A/D converter 14, and the clock distributor 16. These clock signals are created from the master clock signal, and are synchronized with the transmit sampling clock signal. The clock distributor 16 generates further clock signals which it supplies to the DSP 10, the frequency converter 12, and an interpolator 20 to be described later.

The voice-band signal processor moreover comprises a status register circuit 17, which is connected to the flag registers 11 in the DSP 10, and to the control/address bus 4 and the status data bus 5. According to signals on the control/address bus 4, data on the status data bus 5 can be written in the status register circuit 17, or data in the status register circuit 17 can be read onto the status data bus 5. Similarly, the status register circuit 17 can read and write the flag data in the flag registers 11, to which it is connected by an internal bus 18.

The voice-band signal processor also comprises a receive signal data bus 19, an interpolator 20, and a pseudo-analog data bus 21. The receive signal data bus 19 carries a filtered, digital voice-band receive signal from the DSP 10 to the interpolator 20. The interpolator 20 interpolates this signal to create a pseudo-analog receive signal. The pseudo-analog data bus 21 carries this pseudo-analog receive signal to the main bus 1, from which it can be read by the demodulator.

Next the internal structure of the DSP 10 will be described with reference to FIG. 2. The description will be confined to those parts of the DSP 10 that are concerned with the flag registers 11 and with sequence control. It should be understood that the DSP 10 comprises many well-known elements such as arithmetic, logic, and memory elements that are not shown in FIG. 2.

Figure 2:
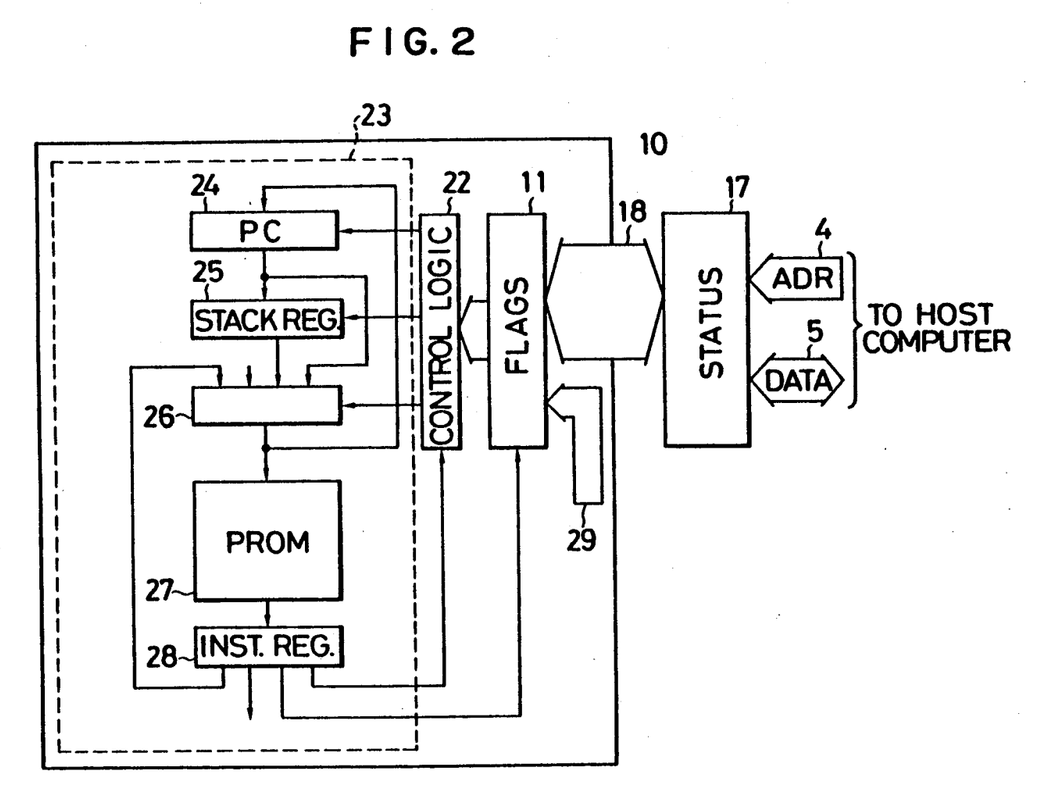
FIG. 2 is a more detailed block diagram of the DSP in FIG. 1.

From FIG. 2 it can be seen that the DSP 10 comprises, in addition to the flag registers 11, a control logic circuit 22 and a sequencer 23. The flag registers 11 provide flag information to the control logic circuit 22, which generates control signals in accordance with the flag information and supplies them to the sequencer 23. The sequencer 23 returns information to the flag registers 11 and the control logic circuit 22.

The sequencer 23 comprises a program counter 24, a stack register 25, a selector 26, a PROM 27, and a instruction register 28. During normal program execution, the program counter 24 generates the address of the next instruction to be executed and sends it to the selector 26, which selects it and sends it to the PROM 27. The instruction at this address is then read from the PROM 27 into the instruction register 28 and executed by arithmetic and logic circuits not shown in the drawing. Instruction results are supplied via internal signal lines 29 to the flag registers 11, where they cause various flag bits to be set. This flag information is transferred via the internal bus 18 to the status register circuit 17 so that if necessary it can be read by the host computer via the status data bus 5. The instruction register 28 also sends signals to the flag registers 11, the control logic circuit 22, and to various circuits not shown in the drawing.

While one instruction is being selected and executed as described above, the program counter 24 is incremented to the next instruction address; then the same cycle repeats. In this way instructions are executed in sequence.

The normal instruction execution sequence can be varied to jump from one program or part thereof to another, or to branch to and return from a subroutine. Jump and branch destination addresses are supplied from the instruction register 28 to the selector 26, while return addresses are generated by the program counter 24, stored in the stack register 25, and supplied from the stack register 25 to the selector 26. The selector 26 may also receive, for example, a reset-start address from a circuit not shown in the drawing. The function of the selector 26 is to select one of the addresses supplied to it and furnish that address to the PROM 27 in order to read the instruction at the selected address. The selected address is also returned to the selector 26, which increments it to generate the next instruction address as described above. All this is done under the control of signals supplied from the control logic circuit 22 to the program counter 24, the stack register 25, and the selector 26.

Next an example of the internal structure of the status register circuit 17 will be described with reference to FIG. 3.

Figure 3:
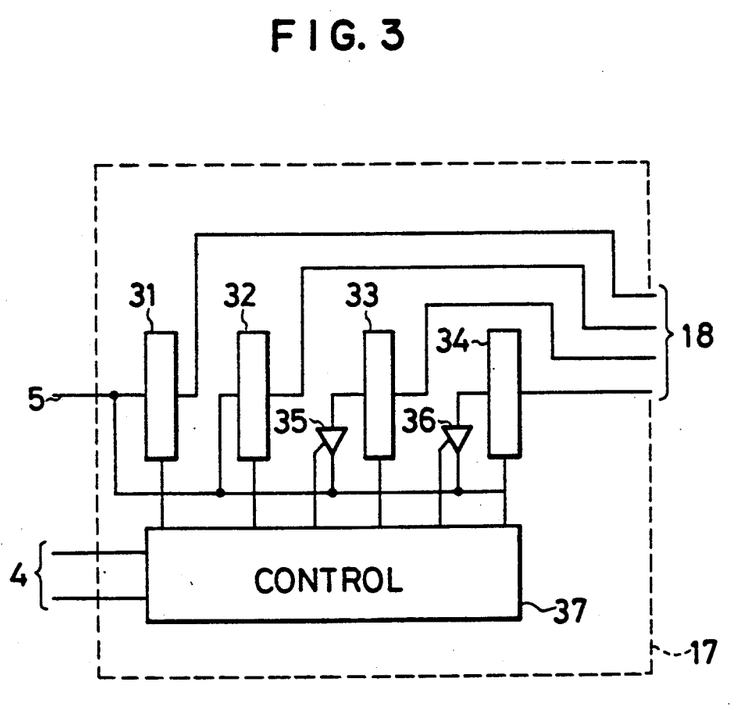
FIG. 3 is a more detailed block diagram of the status register circuit in FIG. 1.

In the example in FIG. 3, the status register circuit 17 comprises a pair of write-only registers 31 and 32, a pair of read-only registers 33 and 34, a pair of buffer amplifiers 35 and 36, and a control circuit 37. The write-only registers 31 and 32 are connected to the status data bus 5, the internal bus 18, and the control circuit 37. Data on the status data bus 5 are written in the write-only registers 31 and 32 under the control of signals from the control circuit 37, then transferred from the write-only registers 31 and 32 to the internal bus 18, thence to the flag registers 11 in the DSP 10. The read-only registers 33 and 34 are connected to the internal bus 18, the buffer amplifiers 35 and 36, and the control circuit 37. Data from the flag registers 11 in the DSP 10 are transferred via the internal bus 18 to the read-only registers 33 and 34 under control of signals from the control circuit 37, then sent to the buffer amplifiers 35 and 36. The buffer amplifiers 35 and 36 are connected to the status data bus 5 and the control circuit 37, and transfer data from the read-only registers 33 and 34 to the status data bus 5 under control of signals from the control circuit 37. The control circuit 37 is connected to the control/address bus 4, and controls the reading and writing of the write-only registers 31 and 32 and the read-only registers 33 and 34 according to address and control information received from the control/address bus 4.

Figure 4:
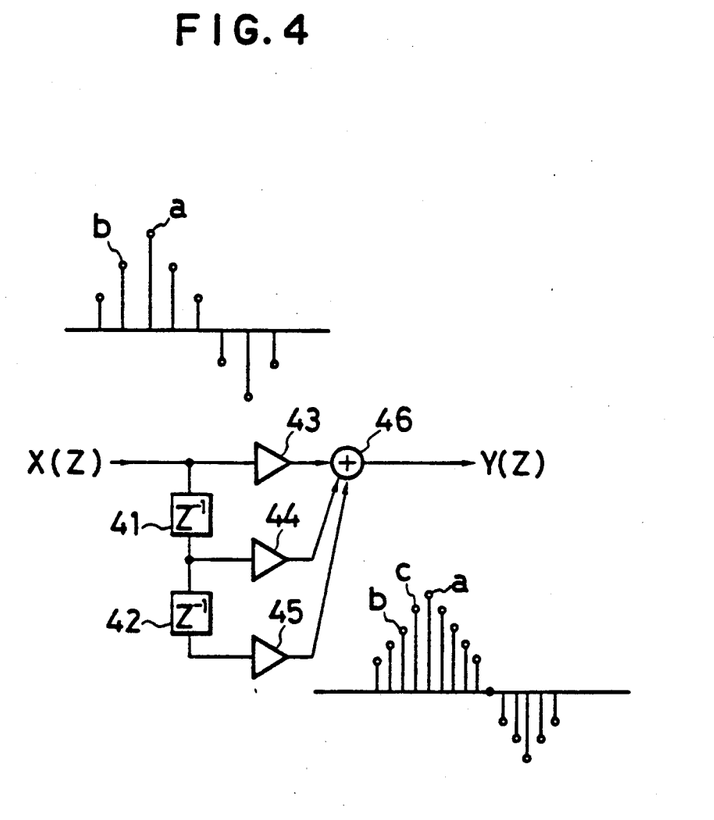
FIG. 4 is a schematic diagram of an interpolation circuit stage that can be employed in the interpolator in FIG. 1.

Next the internal structure of the interpolator 20 will be described with reference to FIG. 4. The interpolator 20 comprises a plurality of interpolation circuits connected in cascade; FIG. 4 shows an example of the structure of one of these interpolation circuits.

The interpolation circuit in FIG. 4 comprises a first delay element 41 for receiving an input signal and delaying it by a certain unit of time, a second delay element 42 for receiving the output of the first delay element 41 and delaying it by the same unit of time, a first weighting amplifier 43 which receives the input signal and amplifies it by a first gain factor, a second weighting amplifier 44 which receives the output of the first delay element 41 and amplifies it by a second gain factor, and a third weighting amplifier 45 which receives the output of the second delay element 42 and amplifies it by a third gain factor. The outputs of the first weighting amplifier 43, the second weighting amplifier 44, and the third weighting amplifier 45 are supplied to an adder 46, which adds them to produce an interpolated output signal.

FIG. 4 also shows an example of the input and output of this circuit for the case in which the first, second, and third gain factors are in the ratio of 1:2:1. The effect of the circuit is to interpolate an intermediate value between each pair of input values: for example, to interpolate the value c between the values a and b.

The circuit in FIG. 4 can be described in mathematical terms as follows. Let $X(z)$ be the input signal and $Y(z)$ be the interpolated output signal. The function of the delay elements 41 and 42 is equivalent to multiplication by $z^{-1}$, and the functions of the weighting amplifiers 43, 44, 45 are equivalent to multiplication by 1, 2, and 1 respectively. Thus:

$$Y(z) = (1 + 2z^{-1} + z^{-2})X(z)$$

The interpolation function $H(z)$ is accordingly:

$$\begin{aligned}H(z) &= Y(z)/X(z) = (1 + z^{-1})^2 \\ &= \{(1 - z^{-2})/(1 - z^{-1})\}^2\end{aligned}$$

The circuit in FIG. 4 is only one possible example of one stage of the interpolator 20. The general form of the interpolation function for the interpolator 20 is:

$$H_1(z) = \{(1 - z^{-r})/(1 - z^{-1})\}^n$$

where $z = e^{ST}$, T being the sampling period and r being the number of samples interpolated per sampling period.

Descriptions of the internal structure of the frequency converter 12, the D/A converter 13, the A/D converter 14, the phase-locked loop 15, and the clock distributor 16 will be omitted, since these are all well-known devices.

Next the operation of the novel voice-band signal processor will be described. First its operation in the half duplex transmit mode will be described with reference to FIGS. 1 and 5, then its operation in the full duplex mode will be described with reference to FIGS. 1 and 6, after which the switching of modes will be described with reference to FIGS. 2 and 3.

In the half duplex transmit mode, the function of the voice-band signal processor is to receive a modulated digital voice-band signal from a modulator, filter this signal, and convert it to an analog voice-band signal to be transmitted on the communication line. As a specific example, the digital voice-band signal will be assumed to arrive from the modulator at a rate of 9.6 kHz, meaning that the voice-band signal processor receives 9600 16-bit digital sample values per second via the main bus 1 in FIG. 1. The transmit sampling clock signal received at the sampling clock input terminal 8 also has a frequency of 9.6 kHz, which is appropriate for the transmission of data at a rate of 9600 bits per second.

Figure 5:
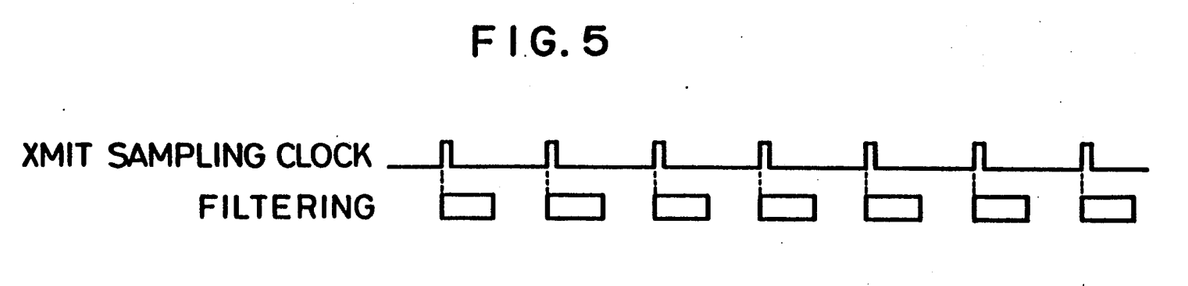
FIG. 5 illustrates the timing of the operation of the DSP in the half duplex mode.

The digital signal sample data from the modulator are written into the DSP 10 in synchronization with a write clock signal from the modulator received at the write clock input terminal 2. The DSP 10 operates on a clock signal generated by the phase-locked loop 15 and the clock distributor 16, synchronized with the transmit sampling clock signal received at the sampling clock input terminal 8. FIG. 5 illustrates the timing of the operation. In each transmit sampling clock period, the DSP 10 performs a digital filtering process to restrict the frequency band of the digital voice-band signal data received via the main bus 1, using half of the clock period to accomplish this process, and generates a filtered digital voice-band signal which it sends to the frequency converter 12. The filtered digital voice-band signal is sent from the DSP 10 to the frequency converter 12 at a rate of 19.2 kHz, two sample values being sent in each transmit sampling clock period.

Operating on a clock signal received from the clock distributor 16, the frequency converter 12 performs an interpolation process that creates 135 digital sample values for each digital sample value received from the DSP 10. The frequency converter 12 sends these values to the D/A converter 13 at the oversampling rate of $135 \times 19.2$ kHz = 2.592 MHz.

The D/A converter 13, operating on a clock signal received from the phase-locked loop 15, converts the digital values received from the frequency converter 12 at the oversampling rate to an analog signal, which it provides to the analog output terminal 6, thus completing the half duplex operation performed by the voice-band signal processor.

Next the operation performed by the voice-band signal processor in the full duplex mode will be explained. In this mode the voice-band signal processor must perform the same transmit filtering and digital-to-analog conversion functions as in the half duplex transmit mode, and at the same time convert an analog voice-band signal received at the analog input terminal 7 to a digital signal, filter it, and supply the filtered signal to a demodulator via the main bus 1. The demodulator samples the filtered signal at a rate determined by an external circuit for detecting the carrier signal of the analog receive voice-band signal and regenerating a receive sampling clock signal that duplicates the transmit sampling clock signal used at the other end of the communication line. The bit rate of the receive signal is equal to the bit rate of the transmit signal, so the regenerated receive sampling clock signal should ideally be equal in frequency to the transmit sampling clock signal received at the sampling clock input terminal 8, but due to temperature differences, differences between crystals, and other factors, the frequency equality between the transmit and receive sampling clock signals may be only approximate.

The transmit filtering and digital-to-analog conversion functions in full duplex operation are performed in substantially the same way as already described for half duplex operation. The receive analog-to-digital conversion and filtering functions are performed as follows, assuming the same bit rate and frequency parameters as before.

The analog voice-band signal from the communication line is received at the analog input terminal 7 and converted by the A/D converter 14 to a digital signal, which is sent to the frequency converter 12 at the oversampling rate of 2.592 MHz. The frequency converter 12 decimates this signal by selecting every 350th sample, and sends the selected samples at the rate of 19.2 kHz to the DSP 10. The DSP 10 performs a digital band-restriction filtering process and generates a filtered digital voice-band signal which it outputs at a rate of 9.6 kHz via the receive signal data bus 19 to the interpolator 20. The interpolator 20, operating on a clock signal received from the clock distributor 16, performs an interpolation process that creates 270 digital values for each value received from the DSP 10, thus creating a pseudo-analog voice-band signal which it sends via the pseudo-analog data bus 21 to the main bus 1. The demodulator to which the main bus 1 is connected reads this signal by sampling it at a rate determined by the regenerated receive sampling clock signal.

Figure 6:
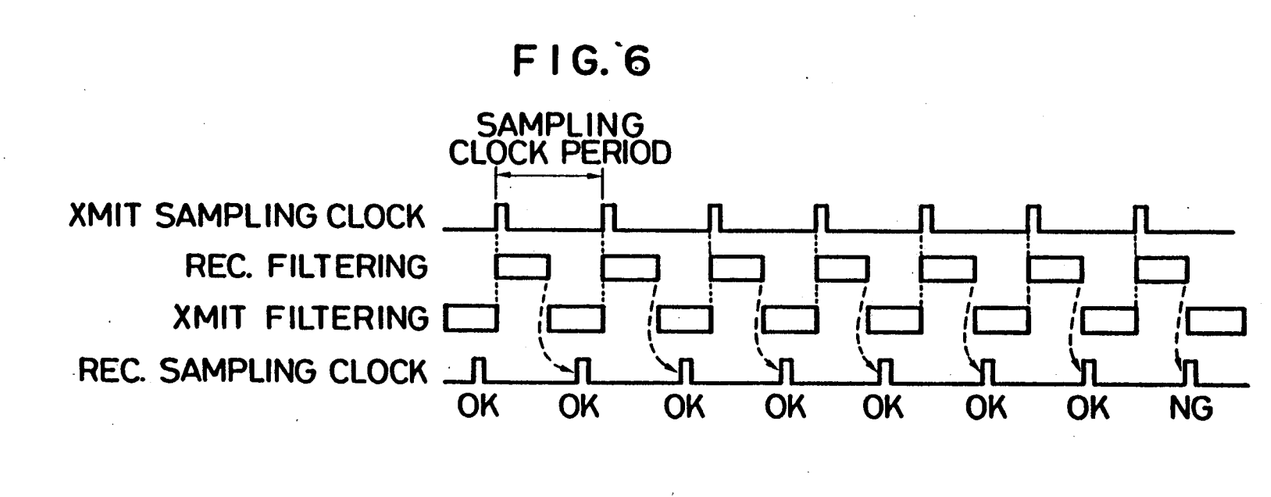
FIG. 6 illustrates the timing of the operation of the DSP in the full duplex transmit mode.

FIG. 6 illustrates the timing of the full duplex operation of the DSP 10. As in the half duplex mode, the operation of the DSP 10 is synchronized with the transmit sampling clock, which is being assumed to run at a rate of 9.6 kHz. In the first half of each transmit sampling clock period, the DSP 10 executes a filtering process on the receive signal obtained from the frequency converter 12. The filtered receive signal is output from the DSP 10 at a rate of one digital sample value per period of the transmit sampling clock. In the second half of each transmit sampling clock period, the DSP 10 executes a filtering process on the transmit signal obtained from the modulator via the main bus 1.

Figure 7:
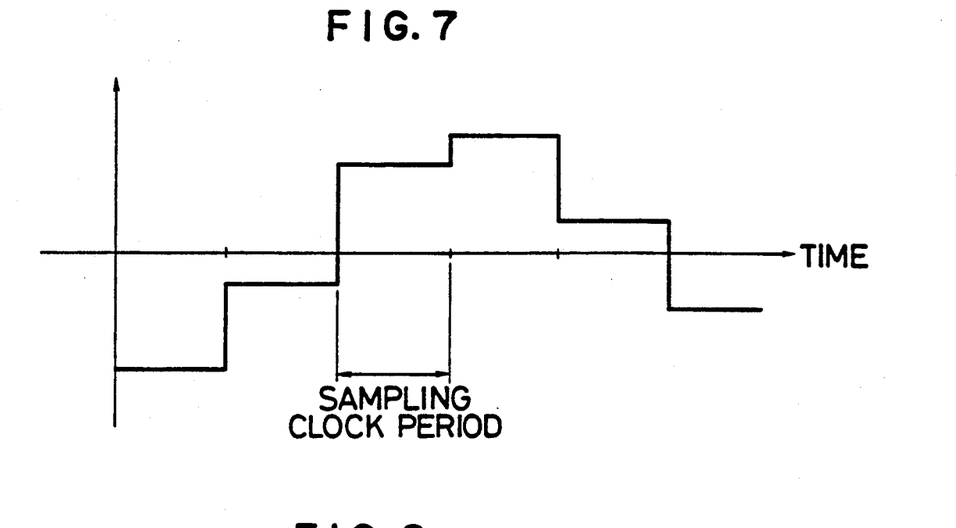
FIG. 7 shows an example of a filtered digital voice-band signal.

FIG. 7 shows an example of the filtered digital receive voice-band signal output by the DSP 10, this being a pulse-amplitude modulation (PAM) signal with a 100% duty ratio. Successive values are output during successive periods of the transmit clock, with large jumps from one value to the next.

Figure 8:
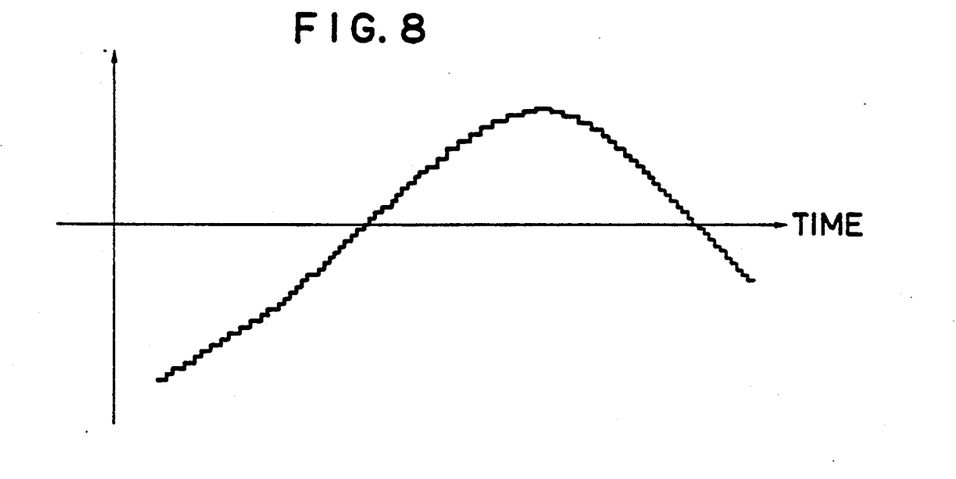
FIG. 8 illustrates a pseudo-analog signal resulting from interpolation of the signal in FIG. 7 by the interpolator.

FIG. 8 shows the same signal after it has been interpolated by the interpolator 20. Although the signal is still digital, being described by successive 16-bit digital values, the number of values is greatly increased, so the jumps from one value to the next are much smaller, making the signal pseudo-analog in appearance.

The bottom line in FIG. 6 shows the receive sampling clock signal used by the demodulator to sample the filtered receive signal output by the DSP 10. As noted earlier, the receive sampling clock rate does not in general match the transmit sampling clock rate exactly; in FIG. 6 the receive sampling clock is shown as running somewhat faster. The demodulator reads the filtered receive signal from the main bus 1 once at each receive sampling clock pulse.

If the demodulator were to read the filtered receive signal in FIG. 7 directly, as in the prior art, then under the timing conditions in FIG. 6, the point at which the signal was read would gradually drift forward with respect to the transmit sampling clock. As long as the drift stayed within the same transmit sampling clock period, the data obtained would have substantially the correct value, indicated by the letters OK in FIG. 6, but when the drift crossed into the preceding transmit sampling clock period, the demodulator would read the same value in FIG. 7 twice. The major distortion occurring at this point, marked NG in FIG. 6, could lead to a demodulation error, causing the host computer to receive incorrect data.

In the novel voice-band signal processor, however, the demodulator reads the pseudo-analog signal in FIG. 8 which contains no large jumps. Accordingly, even if the point at which the demodulator reads the signal drifts with respect to the transmit sampling clock, no major distortion occurs, and demodulation can be carried out correctly.

Next the switching of the voice-band signal processor among various communication modes will be described with reference to FIGS. 2 and 3. The capability to switch modes enables the same voice-band signal processor to operate in either half or full duplex mode, for example, or at different bit rates. In the following description, operation at different bit rates will be discussed as an example.

The PROM 27 in FIG. 2 comprises three or more distinct program areas. One of these is a common area comprising a basic routine that reads the values of flags in the flag registers 11, determines the current communication mode, and branches to another program area as necessary. The other program areas contain programs for operating in different communication modes: for example, one area may contain a program for operating at a bit rate of 2400 bps, while another may contain a program for operating at a bit rate of 9600 bps. It is not necessary to provide a completely separate program for each communication mode; routines common to two or more modes can efficiently be stored in the common area as subroutines.

To set the operating mode to 2400 bps, for example, the host computer writes appropriate data in the status register 17. These values are transferred under control of the control circuit 37 in FIG. 3 to the flag registers 11 in the DSP 10, where they cause the DSP 10 to begin operating. Operation is originally under control of the basic routine in the common area in the PROM 27. This routine reads the flag registers 11, determines that 2400 bps-mode operation is required, and branches to the 2400 bps-mode program area. The DSP 10 then continues to operate in the 2400 bps-mode, executing the filtering functions described earlier.

To change the operating mode to 9600 bps, for example, the host computer writes a new set of data in the status register circuit 17. Transferred to the flag registers 11, these data cause program execution to restart from the basic routine in the common area which reads the flag registers 11, determines that 9600 bps-mode operation is required, and branches to the 9600 bps-mode program area. The DSP 10 then continues to operate in the 9600 bps mode.

In addition to setting the operating mode of the DSP 10 in this way, the host computer can read flag information from the flag registers 11 via the status register circuit 17 to determine the results of instructions executed by the DSP 10. For example, it can determine whether the result of an instruction was positive, negative, or zero. Depending on the programming of the DSP 10, the host computer may in this way be able to determine when a certain type of signal is received at the analog input terminal 7. It will be apparent that this ability, combined with the ability to set the operating mode, enables the host computer to control the DSP 10 in a flexible manner not possible in the prior art.

Figure 9:
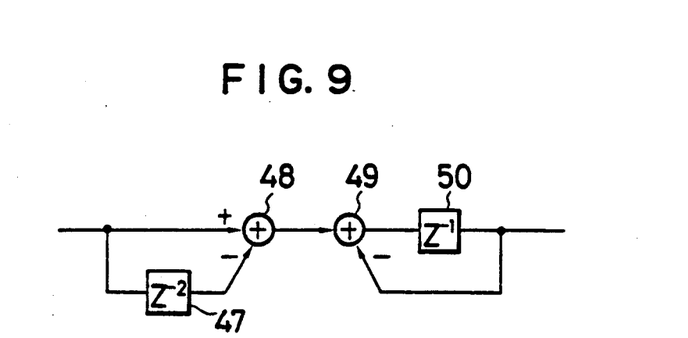
FIG. 9 illustrates an alternative interpolation circuit stage that can be used in the interpolator in FIG. 1.

FIG. 9 shows another example of an interpolation circuit stage that can be used in the interpolator 20. The circuit in FIG. 9 circuit comprises a first delay element 47 for receiving an input signal and delaying it by two units of time, a first adder 48 for receiving the same input signal and the output of the first delay element and adding them, a second adder 49 for receiving the output of the first adder and an interpolated output signal and adding them, and a second delay element 50 for receiving the output of the second adder and delaying it by one unit of time to generate the interpolated output signal.

The function of the first delay element can be expressed mathematically as $z^{-2}$ and the function of the second delay element as $z^{-1}$, so the interpolation function $H_2$ of this circuit is:

$$H_2(z)=(1-z^{-2})/(1-z^{-1})$$

It follows that a plurality of circuits of the form shown in FIG. 9 can be connected in series to obtain the same function as with the circuit in FIG. 4. Circuits of the structure shown in FIG. 9 can be used either in place of or in addition to circuits of the structure shown in FIG. 4.

The features of novelty in this invention are the interpolator 20, which avoids timing problems caused by mismatching of the transmit and receive sampling clock rates, and the flag registers 11 and status register circuit 17, which enable an external device to switch the voice-band signal processor among a variety of operating modes and to obtain internal status information from the voice-band signal processor. In the foregoing description both of these features have been shown incorporated into the same voice-band signal processor, but they can be used separately as well. A voice-band signal processor which will be used for full duplex communication at a single bit rate, for example, can incorporate the interpolator 20 without the flag registers 11 and the status register circuit 17. Alternatively, a voice-band signal processor which will be used only for half duplex communication but must support a variety of bit rates can incorporate the flag registers 11 and the status register circuit 17 without the interpolator 20.

The scope of this invention is not restricted to the structures shown in the drawings and described above, but includes many modifications and variations which will be apparent to one skilled in the art. In particular, the sampling frequencies, bit rates, and bus widths described above are intended only to exemplify possible values, and the internal structure of the DSP, the status register circuit, and the interpolator can differ from the structures shown in the drawings.

What is claimed is:

1. A voice-band signal processor for converting a digital transmit voice-band signal to an analog transmit voice-band signal, and for converting an analog receive voice-band signal to a pseudo-analog receive voice-band signal, comprising:
   a digital signal processor for receiving said digital transmit voice-band signal and performing a digital filtering process to generate a filtered digital transmit voice-band signal, and for receiving a digital receive voice-band signal and performing a digital filtering process to generate a filtered digital receive voice-band signal;
   a D/A converter coupled to said digital signal processor, for receiving said filtered digital transmit voice-band signal and converting it to analog form to generate said analog transmit voice-band signal;

an A/D converter coupled to said digital signal processor, for receiving said analog receive voice-band signal and converting it to digital form to generate said digital receive voice-band signal; and an interpolator coupled to said digital signal processor, for receiving said filtered digital receive voice-band signal and performing an interpolation process to generate said pseudo-analog receive voice-band signal.

2. The voice-band signal processor of claim 1, wherein said interpolator comprises a series of interpolation circuits connected in cascade.

3. The voice-band signal processor of claim 2, wherein the respective interpolation circuits comprise:
   a first delay element for receiving an input signal and delaying it by a certain unit of time;
   a second delay element for receiving the output of said first delay element and delaying it by the same unit of time;
   a first weighting amplifier for receiving said input signal and amplifying it by a first gain factor;
   a second weighting amplifier for receiving the output of said first delay element and amplifying it by a second gain factor;
   a third weighting amplifier for receiving the output of said second delay element and amplifying it by a third gain factor; and
   an adder for receiving the outputs of said first weighting amplifier, said second weighting amplifier and said third weighting amplifier, and adding said outputs to generate an interpolated output signal.

4. The voice-band signal processor of claim 3, wherein said first gain factor, said second gain factor, and said third gain factor are in the ratio 1:2:1.

5. The voice-band signal processor of claim 2, wherein said interpolation circuit comprises:
   a first delay element for receiving an input signal and delaying it by two units of time;
   a first adder for receiving said input signal and the output of said first delay element and adding them;
   a second adder for receiving the output of said first adder and an interpolated output signal and adding them; and
   a second delay element for receiving the output of said second adder and delaying it by one unit of time to generate said interpolated output signal.

6. The voice-band signal processor of claim 1, wherein said digital signal processor comprises one or more flag registers for storing information pertaining to a communication mode.

7. The voice-band signal processor of claim 6, wherein said digital signal processor comprises a programmable read-only memory divided into different program areas that are selected according to information in said flag registers.

8. The voice-band signal processor of claim 7, further comprising a status register circuit coupled to said flag registers, wherein information can be transferred between said status register circuit and said flag registers, and information can be written in and read from said status register circuit by an external device.

9. The voice-band signal processor of claim 8, wherein said status register circuit comprises one or more write-only register for the transfer of information from said external device to said voice-band signal processor, and one or more read-only register for the transfer of information from said voice-band signal processor to said external device.

10. The voice-band signal processor of claim 1, wherein said D/A converter and A/D converter operate at an oversampling rate exceeding the sampling rate of said digital signal processor, said voice-band signal processor further comprising a frequency converter inserted between said digital signal processor on the one hand and said A/D converter and D/A converter on the other hand, for performing interpolation and decimation operations to convert between their differing sampling frequencies.

11. A voice-band signal processor for converting a digital transmit voice-band signal to an analog transmit voice-band signal, for converting an analog receive voice-band signal to a pseudo-analog receive voice-band signal, comprising:
    a digital signal processor for receiving said digital transmit voice-band signal and performing a digital filtering process to generate a filtered digital transmit voice-band signal, and for receiving a digital receive voice-band signal and performing a digital filtering process to generate a filtered digital receive voice-band signal;
    a D/A converter coupled to said digital signal processor, for receiving said filtered digital transmit voice-band signal and converting it to analog form to generate said analog transmit voice-band signal; and
    an A/D converter coupled to said digital signal processor, for receiving said analog receive voice-band signal and converting it to digital form to generate said digital receive voice-band signal;
    wherein said digital signal processor comprises one or more flag registers for storing information pertaining to the communication mode.

12. The voice-band signal processor of claim 11, wherein said digital signal processor comprises a programmable read-only memory divided into different program areas that are selected according to information in said flag registers.

13. The voice-band signal processor of claim 12, further comprising a status register circuit coupled to said flag registers, wherein information can be transferred between said status register circuit and said flag registers, and information can be written in and read from said status register circuit by an external device.

14. The voice-band signal processor of claim 12, wherein said status register circuit comprises one or more write-only register for the transfer of information from said external device to said voice-band signal processor, and one or more read-only register for the transfer of information from said voice-band signal processor to said external device.

15. The voice-band signal processor of claim 11, wherein said D/A converter and A/D converter operate at an oversampling rate exceeding the sampling rate of said, digital signal processor further comprising a frequency converter inserted between said digital signal processor on the one hand and said A/D converter and D/A converter on the other hand, for performing interpolation and decimation operations to convert between their differing sampling frequencies.

* * * * *